United States Patent
Ahn

(10) Patent No.: US 8,778,710 B2
(45) Date of Patent: Jul. 15, 2014

(54) DISPLAY SUBSTRATE AND METHOD OF FABRICATING THE SAME

(71) Applicant: Samsung Display Co., Ltd., Yongin (KR)

(72) Inventor: Byeong-Jae Ahn, Suwon-si (KR)

(73) Assignee: Samsung Display Co., Ltd. (KR)

( * ) Notice: Subject to any disclaimer, the term of this patent is extended or adjusted under 35 U.S.C. 154(b) by 113 days.

(21) Appl. No.: 13/682,371

(22) Filed: Nov. 20, 2012

(65) Prior Publication Data

US 2013/0078751 A1    Mar. 28, 2013

Related U.S. Application Data

(62) Division of application No. 12/903,939, filed on Oct. 13, 2010, now Pat. No. 8,350,266.

(30) Foreign Application Priority Data

Apr. 14, 2010 (KR) .......... 10-2010-0034289

(51) Int. Cl.
| | |
|---|---|
| *H01L 21/00* | (2006.01) |
| *H01L 33/00* | (2010.01) |
| *H01L 21/02* | (2006.01) |
| *H01L 27/12* | (2006.01) |
| *H01L 27/32* | (2006.01) |

(52) U.S. Cl.
CPC ........ *H01L 33/005* (2013.01); *H01L 21/02104* (2013.01); *H01L 21/02697* (2013.01); *H01L 27/3237* (2013.01); *H01L 27/1214* (2013.01)
USPC ................. 438/30; 438/31; 438/48; 438/128; 438/149

(58) Field of Classification Search
CPC ............ H01L 27/3237; H01L 27/3244; H01L 27/1214; H01L 33/005; H01L 21/02104; H01L 21/02697
USPC ................................ 438/30, 31, 48, 128, 149
See application file for complete search history.

(56) References Cited

U.S. PATENT DOCUMENTS

| | | | |
|---|---|---|---|
| 7,811,870 B2 * | 10/2010 | Oh et al. ........................ 438/158 |
| 2004/0263706 A1 | 12/2004 | Cho et al. | |
| 2007/0034879 A1 | 2/2007 | Park et al. | |
| 2007/0166859 A1 | 7/2007 | Lee et al. | |

* cited by examiner

*Primary Examiner* — Long K Tran

(74) *Attorney, Agent, or Firm* — Innovation Counsel LLP

(57) ABSTRACT

A display substrate is provided that can prevent the opening of an upper conduction layer. The display substrate comprises a semiconductor layer pattern formed on a substrate, a data interconnection pattern formed on the semiconductor layer pattern, a protection layer formed on the substrate and the data interconnection pattern, contact holes formed on the substrate to expose at least a portion of an upper surface of the semiconductor pattern and at least a portion of an upper surface of the data interconnection pattern, and contact electrodes formed in the contact holes to be in contact with the exposed upper surfaces of the data interconnection pattern and the semiconductor layer pattern.

13 Claims, 15 Drawing Sheets

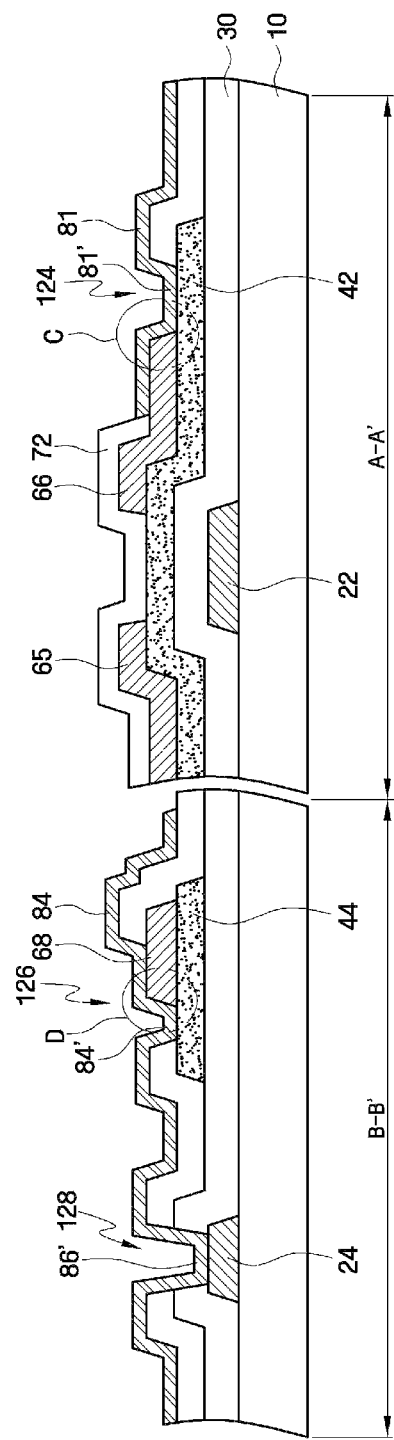

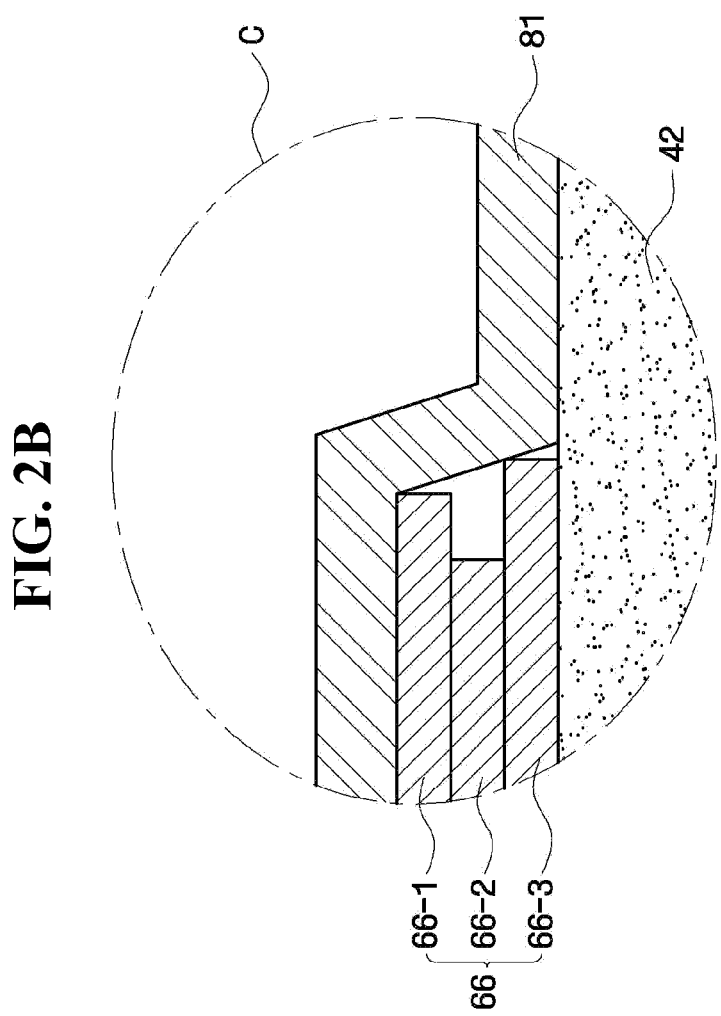

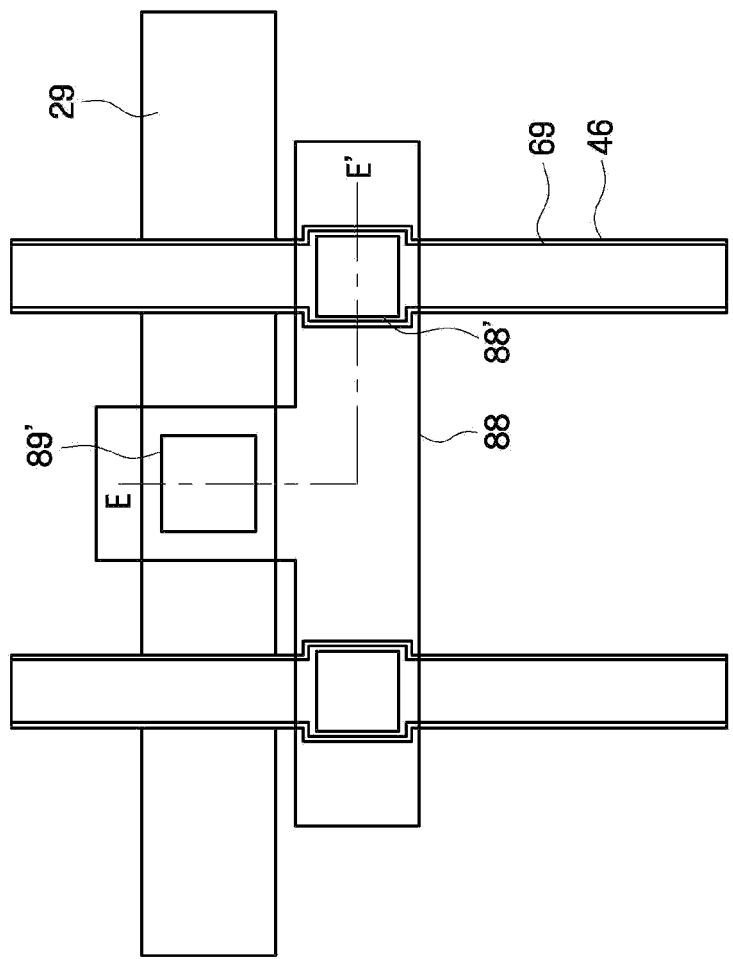

DISPLAY SUBSTRATE AND METHOD OF FABRICATING THE SAME

CROSS-REFERENCE TO RELATED APPLICATION

This application is a divisional application of U.S. patent application Ser. No. 12/903,939 filed on Oct. 13, 2010, which claims priority to Korean Patent Application No. 10-2010-0034289, filed on Apr. 14, 2010, in the Korean Intellectual Property Office and all the benefits accruing therefrom under 35 U.S.C. §119, the contents of the prior applications being herein incorporated by reference.

BACKGROUND

1. Field of the Invention

The present invention relates to a display substrate and a method of fabricating the same.

2. Description of the Prior Art

A liquid crystal display, which is one of the most widely used types of flat panel displays, includes two substrates, on which electrodes are formed, and a liquid crystal layer interposed between the two substrates. In such a liquid crystal display, liquid crystal molecules of the liquid crystal layer are rearranged in accordance with voltages being applied to the electrodes. Thus the quantity of light passing through the liquid crystal layer is adjusted, causing an image to be displayed.

One of the two substrates described above is a thin film transistor substrate, which is an insulating substrate on which a plurality of interconnections are formed. A representative method of forming such interconnections is the photolithographic method of laminating component materials and patterning the component materials using a mask process. However, such a photolithographic method requires a number of processing steps, such as thin film deposition, photoresist spreading, mask alignment, exposing, developing, etching, stripping, and the like. The large number of processing steps can increase the process time and manufacturing cost for fabricating the thin film transistor substrate.

A liftoff method can be used to reduce the number of mask processes when fabricating the thin film transistor. In the liftoff method, the process of fabricating a thin film transistor substrate includes a process of removing a photoresist pattern of which the upper surface is covered with a conduction material, and the photoresist pattern and the conduction material formed thereon are simultaneously removed by the liftoff method.

In order to effectively remove the photoresist pattern using the above-described method, a sufficient undercut on the lower part of the photoresist pattern must be formed by etching a protection layer (sacrificial layer) positioned on the lower part of the photoresist pattern.

On the other hand, a portion of the interconnections may be formed in a multi-film (layer) structure, and if a relatively depressed film (layer) exists on one end portion of the multi-film (layer), a stepped portion may be formed on the protection layer that is spread on the upper part thereof This may, however, cause a problem in that an upper conduction layer (e.g., a pixel electrode) to be formed on the protection layer may be opened.

SUMMARY

A display substrate is provided that can prevent the opening of an upper conduction layer and thus improve the reliability.

A method of fabricating a display substrate is also provided that can prevent the opening of an upper conduction layer and thus improve the reliability.

A display substrate includes a semiconductor layer pattern formed on a substrate; a data interconnection pattern formed on the semiconductor layer pattern; a protection layer formed on the substrate and the data interconnection pattern; contact holes formed on the substrate to expose at least a portion of an upper surface of the semiconductor pattern and at least a portion of an upper surface of the data interconnection pattern; and contact electrodes formed in the contact holes to be in contact with the exposed upper surfaces of the data interconnection pattern and the semiconductor layer pattern.

In another aspect a method of fabricating a display substrate includes sequentially forming a semiconductor layer and a data interconnection on a substrate; forming a semiconductor layer pattern and a data interconnection pattern by etching the semiconductor layer and the data interconnection so that an end portion of the semiconductor layer pattern protruded in one direction beyond an end portion of the data interconnection pattern; forming a protection layer and a sacrificial layer on the substrate; forming contact holes so that at least a portion of an upper surface of the semiconductor layer pattern and at least a portion of an upper surface of the data interconnection pattern are exposed by etching the protection layer using an etching selection ratio of the protection layer and the semiconductor layer pattern in which the etch rate of the protection layer is greater than the etch rate of the semiconductor layer pattern; and forming contact electrodes in the contact holes.

In still another aspect a method of fabricating a display substrate is provided that includes sequentially forming a semiconductor layer and a data interconnection that comprises first, second and third electrode layers on a substrate; forming a semiconductor layer pattern and a data interconnection pattern that comprises first second, and third electrode layer patterns by etching the semiconductor layer and the data interconnection so that an end portion of the semiconductor layer pattern is protruded in a first direction beyond an end portion of the data interconnection pattern; forming a protection layer and a sacrificial layer on the substrate; forming a first photoresist pattern with a first thickness and a second photoresist pattern with a second thickness that is smaller than the first thickness on the protection layer and the sacrificial layer; forming contact holes so that at least a portion of an upper surface of the semiconductor layer pattern and at least a portion of an upper surface of the data interconnection pattern are exposed by etching the protection layer and the sacrificial layer using an etching selection ratio in which the etch rate of the protection layer is greater than an etch rate of the semiconductor layer and using the first and second photoresist patterns as a mask; forming a third photoresist pattern by etching back the first and second photoresist patterns; forming an undercut by etching an edge portion of the sacrificial layer underneath the third photoresist pattern; forming a conduction layer on an upper part of the third photoresist pattern and on an upper surface of the exposed semiconductor layer pattern so that the conduction layer is in contact with the first or third electrode layer pattern; and lifting off the third photoresist pattern.

BRIEF DESCRIPTION OF THE DRAWINGS

The above and other objects, features and advantages will be more apparent from the following description taken in conjunction with the accompanying drawings, in which:

FIG. 2A is a sectional view taken along lines A-A' and B-B' in FIG. 1;

FIG. 2B is an enlarged view of a region C in FIG. 2A;

FIG. 3A is a plan view of a test interconnection region;

DETAILED DESCRIPTION OF THE PREFERRED EMBODIMENTS

Figure 1:
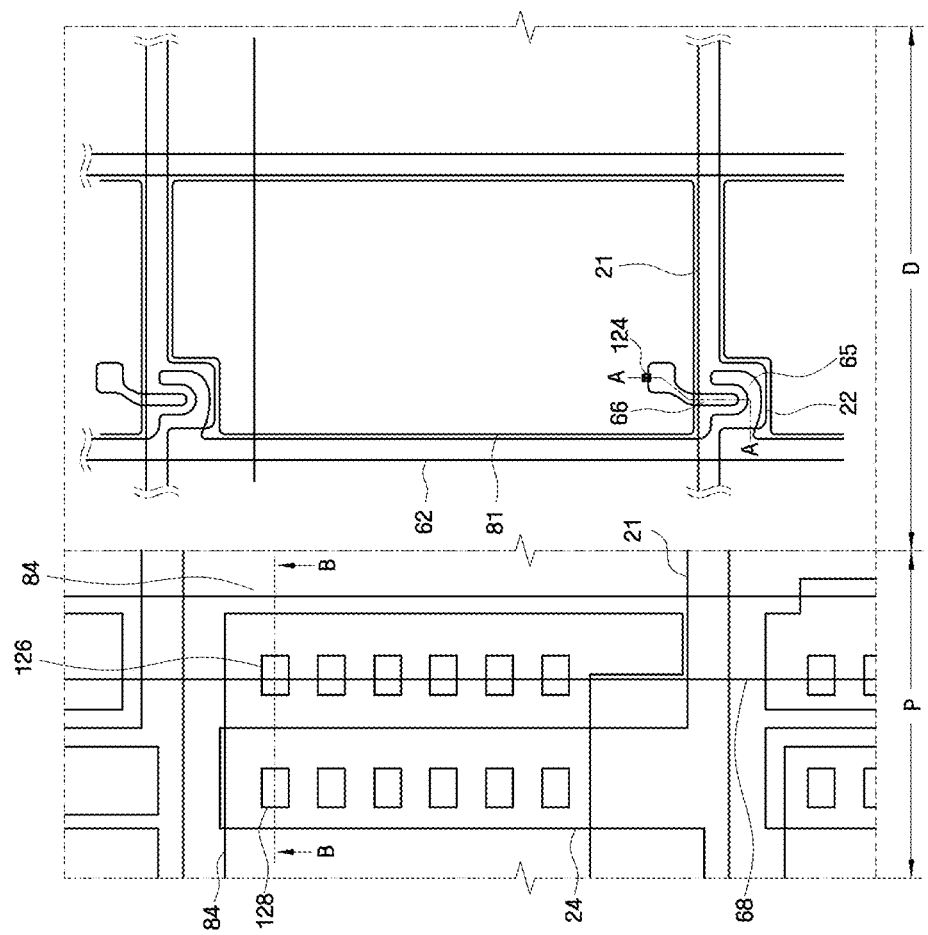
FIG. 1 is a layout diagram of a display substrate according to an exemplary embodiment.

Hereinafter, exemplary embodiments will be described with reference to the accompanying drawings. The aspects and features, and methods for achieving the aspects and features will be apparent by referring to the exemplary embodiments described with reference to the accompanying drawings. However, the present invention is not limited to the exemplary embodiments disclosed hereinafter, but can be implemented in diverse forms. The matters defined in the description, such as the detailed construction and elements, are exemplary details provided to assist persons of ordinary skill in the art in achieving an understanding of the disclosure. In the drawings, sizes and relative sizes of constituent elements may be exaggerated for clarity in explanation.

The term "on" that is used to designate that an element is on another element located on a different layer or a layer includes both a case where an element is located directly on another element or a layer and a case where an element is located on another element via another layer or still another element. By contrast, the term "directly on" means that an element is directly on another element or a layer without intervention of any other element or layer.

In the disclosure, the same drawing reference numerals are used for the same elements across various figures. Also, the term "and/or" includes the respective described items and combinations thereof.

In the disclosure, exemplary embodiments will be described with reference to plane views and sectional views which are ideal schematic views. The form of exemplary views may be modified due to the manufacturing techniques and/or allowable errors. Accordingly, the embodiments are not limited to their specified form as illustrated, but include changes in form being produced according to manufacturing processes. Accordingly, areas exemplified in the drawings have rough properties, and the shapes of areas in the drawings are to exemplify specified forms of areas of elements, but do not limit the scope of the present invention.

Unless specially defined, all terms (including technical and scientific terms) used in the disclosure have meanings commonly understood by persons of ordinary skilled in the relevant art. In addition, terms that are generally used but are not defined in the dictionary are not to be interpreted in an overly idealized or excessive manner, unless they have been clearly and specially defined in the disclosure as such.

Hereinafter, with reference to FIGS. 1 to 2B, a display substrate according to an exemplary embodiment will be described.

FIG. 1 is a layout, top view, diagram of a display substrate according to an exemplary embodiment. FIG. 2A is a sectional view taken along lines A-A' and B-B' in FIG. 1, and FIG. 2B is an enlarged view of region C in FIG. 2A.

Referring to FIGS. 1 and 2A, the display substrate may comprise a display region D and a peripheral region P formed at the edge of the display region D. In exemplary embodiments of the present disclosure, the peripheral region P comprises an ASG contact bridge portion and a test interconnection region, but the present invention is not limited thereto.

On an insulating substrate 10 of the display region D, gate interconnection patterns 21 and 22, a gate insulating layer 30, a semiconductor layer pattern 42, data interconnection patterns 62, 65, and 66, a protection layer 72, and a pixel electrode 81 may be formed. On an insulating substrate 10 of the peripheral region P (e.g. an amorphous silicon gate region as illustrated in FIG. 1 (defined herein as "ASG region")), a gate interconnection pattern 24, a gate insulating layer 30, a semiconductor layer pattern 44, a data interconnection pattern 68, and an ASG bridge electrode 84 may be formed.

The insulating substrate 10 may be formed of a material having heat-resistance and permeability such as, for example, transparent glass or plastic.

On the insulating substrate 10, a gate line 21 extends in a first direction (e.g. horizontal direction) and transfers a gate signal. Gate electrodes 22 and 24 protrude away from gate line 21, and, along with gate line 21, form gate interconnection patterns 21, 22, and 24. Here, the gate electrode 22 together with source electrode 65 and drain electrode 66 (to be described later) may form terminals of a thin film transistor.

The gate interconnection patterns 21, 22, and 24 may be made of, for example, aluminum-based metal such as aluminum (Al) or an aluminum alloy, silver-based metal such as silver (Ag) or a silver alloy, copper-based metal such as copper (Cu) or a copper alloy, molybdenum-based metal such as molybdenum (Mo) or a molybdenum alloy, and a metallic material such as chrome (Cr), titanium (Ti), tantalum (Ta), and the like. Also, the gate interconnection patterns 21, 22, and 24 may have a multilayer structure that includes two conduction layers (not illustrated) having different physical properties.

On the gate interconnection patterns 21, 22, and 24 and the insulating substrate 10, a gate insulating layer 30 may be formed. The gate insulating layer may be composed of, for example, an inorganic insulating material such as silicon oxide (SiOx) or silicon nitride (SiNx), or an organic insulating material such as BCB (BenzoCycloButene), an acrylic material, or polyimide.

The gate insulating layer 30 may be formed so that a pixel region is exposed. Here, the pixel region is defined by the gate interconnection patterns 21 and 22 and data interconnection patterns 62, 65, and 66, and may be understood as a region that transmits light emitted from a backlight assembly (not illustrated) in a liquid crystal display that includes a thin film transistor substrate.

On a portion of an upper part of the gate insulating layer 30, the semiconductor layer patterns 42 and 44 may be formed. The semiconductor layer patterns 42 and 44 are composed, for example, of hydrogenated amorphous silicon, polycrystalline silicon, an organic semiconductor, or the like.

The semiconductor layer patterns 42 and 44 may have diverse shapes such as, for example, an island shape, a line shape, and the like. For example, in the case where the semiconductor layer patterns are in a line shape, semiconductor layer patterns 42 and 44 may be positioned below a data line interconnection pattern 62 and extend up to an upper part of the gate electrode 22. In an exemplary embodiment, the semiconductor layer patterns 42 and 44 may substantially overlap all of the gate electrode 22 and substantially extend underneath the data interconnection patterns 62, 65, 66, and 68.

Figure 3B:
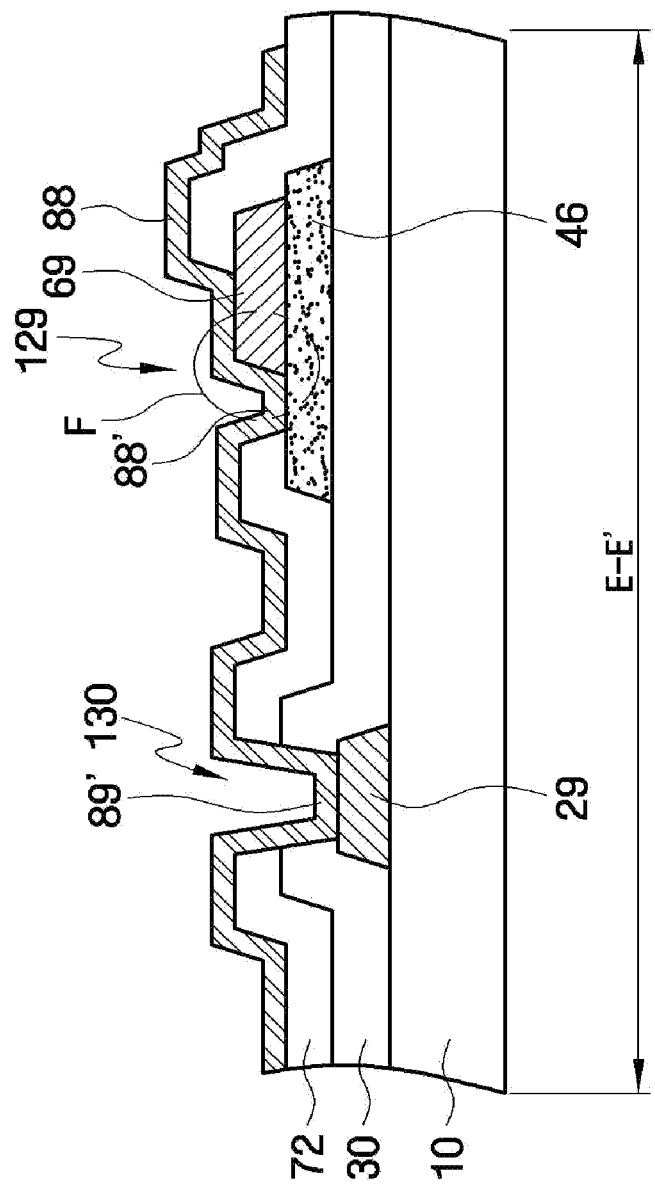
FIG. 3B is a sectional view taken along lint E-E' in FIG. 3A.

Also, cross-sectional profiles and top view profiles of the semiconductor layer patterns (44 in FIG. 2A and 46 in FIGS. 3A and 3B) and the data interconnection patterns (68 in FIGS. 1 and 2A and 69 in FIGS. 3A and 3B), which are formed in regions other than a channel region of a thin film transistor (to be described later), may be substantially the same as illustrated in FIGS. 2A and 3B.

In particular, as illustrated in FIG. 2A, one end portion of the semiconductor layer patterns 42 and 44, may be formed to protrude in a first direction (e.g. horizontal direction) so that it extends beyond an end portion of the data interconnection patterns 66 and 68. Specifically, an end portion of the semiconductor layer pattern 42 may be formed to protrude in the first direction (e.g. the horizontal direction) so that it extends beyond an end portion of a drain electrode 66, such that semiconductor layer pattern 42 is disposed underneath, and extends in a horizontal direction beyond, a side surface of the drain electrode 66. An end portion of the semiconductor layer pattern 44 may be formed to protrude in the first direction (e.g. the horizontal direction) so that it extends beyond an end portion of the data interconnection pattern 68, such that the semiconductor layer pattern 44 is disposed underneath, and extends in a horizontal direction beyond, a side surface of the data interconnection pattern 68. On upper surfaces of the semiconductor layer patterns 42 and 44 that protrude in the first direction (e.g. the horizontal direction), as illustrated, a pixel contact electrode 81' and a first ASG bridge contact electrode 84', respectively, may be formed.

The data interconnection patterns 62, 65, 66, and 68 may be formed on the semiconductor layer patterns 42 and 44 and the gate insulating layer 30. Here, the data interconnection patterns 62, 65, 66, and 68 may comprise data lines 62, data interconnection pattern 68, source electrode 65, and drain electrode 66.

The data line 62 is arranged to extend in a second direction (e.g. a vertical direction) that crosses the gate line 21. Data line 62 serves to transfer an input data signal to the source electrode 65. The source electrode 65, which is branched off from the data line 62, may have one end portion connected to the data line 62 and the other end portion positioned on an upper part of the semiconductor layer pattern 42 to overlap the semiconductor layer pattern 42. The drain electrode 66 may have one end portion that is positioned on the upper part of the semiconductor layer pattern 42 to overlap the semiconductor layer pattern 42, and may be formed apart from the source electrode 65 about the gate electrode 22 at a predetermined distance.

The source electrode 65 and the drain electrode 66 as described above form a thin film transistor together with the gate electrode 22. If a voltage is applied to the gate electrode 22, current flows between the source electrode 65 and the drain electrode 66. The channel region of the thin film transistor is the region between source electrode 65 and the drain electrode 66.

The data interconnection patterns 62, 65, 66, and 68 may have a multilayer structure that is composed of a lower layer of refractory metal and an upper layer of a low-resistant material that is positioned on an upper part of the lower layer. Specifically, with reference to FIG. 2B, the drain electrode 66, which is one of the data interconnection patterns 62, 65, 66, and 68, may have a triple-layer structure that comprises first to third electrode layer patterns 66-1 to 66-3. In this case, an end portion of the drain electrode (i.e. region C in FIG. 2A) may have a side surface profile in which end portions of the first and third electrode layer patterns 66-1 and 66-3 protrude in the first direction (e.g. the horizontal direction) so that they extend beyond an end portion of the second electrode layer pattern 66-2. More specifically, referring to FIG. 2B, the semiconductor layer pattern 42, the third electrode layer pattern 66-3, the first electrode layer pattern 66-1, and the second electrode layer pattern 66-2 may be formed to protrude in the first direction (e.g. horizontal direction) in that order, with the semiconductor layer pattern extending the farthest. Thus, the semiconductor layer pattern 42 is underneath, and extends beyond, the side surfaces of the first, second and third electrode layer patterns 66-1 to 66-3. The third electrode layer pattern 66-3 is underneath, and extends beyond, the first and second electrode layer patterns 66-1 and 66-2. First electrode layer pattern 66-1 is above, and extends in a horizontal direction such that the side surface of first electrode layer pattern 66-1 is between the side surface of the third electrode layer pattern 66-3 and the second electrode layer pattern 66-2. In this case, an end portion of the second electrode layer pattern 66-2 may be relatively depressed in the first direction (e.g. horizontal direction) compared to the location of the end portions of the first and third layer patterns 66-1 and 66-3. The first and third electrode layer patterns 66-1 and 66-3 may be made, for example, of molybdenum (Mo) or a molybdenum (Mo) alloy, and the second electrode layer pattern 66-2 may be made, for example, of aluminum (Al) or an aluminum (Al) alloy.

As described above, one end portion of the drain electrode 66 has been exemplified. However, an end portion of another data interconnection pattern 68 (e.g. region D in FIG. 2A) may be configured in the same manner.

On the data interconnection patterns 62, 65, 66, and 68 and the semiconductor layer patterns 42 and 44, a protection layer 72 (FIG. 2A) composed of an insulating layer may be formed. The protection layer 72 may be made of, for example, an inorganic material such as silicon nitride or silicon oxide, an organic material having superior planarization characteristics and photosensitivity, or an insulating material having low dielectric constant, such as a-Si:C:O, a-Si:o:F, or the like. The protection layer 72 may be formed by plasma enhanced chemical vapor deposition (PECVD).

Contact holes 124, 126, and 128 may be formed on upper parts of the semiconductor layer patterns 42 and 44, the data interconnection patterns 66 and 68, and the gate electrode 24, for exposing at least portions of the upper surfaces of the semiconductor layer patterns 42 and 44, the data interconnection patterns 66 and 68, and the gate electrode 24 may be formed. These contact holes 124, 126, and 128 may be positioned in regions in which contact electrodes 81', 84', and 86' (to be described later) are to be formed, and specifically, regions in which at least portions of the upper surfaces of the semiconductor layer patterns 42 and 44, the data interconnection patterns 66 and 68, and the gate electrode 24 are exposed through the etching of the protection layer 72. Although a portion of the protection layer 72 is etched to form contact holes 124, 126, and 128, at least another portion of the protection layer 72 remains on portions of upper surfaces of the semiconductor layer patterns 42 and 44 that protrude beyond the side surfaces of data line 66 and data line interconnection 68.

The contact electrodes 81', 84', and 86' may be formed inside the contact holes 124, 126, and 128. Specifically, the pixel contact electrode 81' is formed to be in contact with the upper surface of the exposed semiconductor layer pattern 42 in the contact hole 124, and is connected to the drain electrode 66 so as to electrically connect the drain electrode 66 with the pixel electrode 81. In this case, as illustrated in FIG. 2B, the pixel contact electrode 81' may be connected to the first electrode layer pattern 66-1 and the third electrode layer pattern 66-3. On the other hand, although the exemplary embodiment illustrated in FIG. 2B shows that the pixel contact electrode 81' is connected to both the first electrode layer pattern 66-1 and the third electrode layer pattern 66-3, the pixel contact electrode 81' may alternatively be formed to be connected to either the first electrode layer pattern 66-1 or the third electrode layer pattern 66-3 according to the processing conditions.

Although not separately illustrated, the first ASG bridge contact electrode 84' in the region D of FIG. 2A may be formed in the same shape as the above-described pixel contact electrode 81', with first, second and third data line interconnection layers disposed so that the second data line interconnection layer is between the first and third data line interconnection layers and is positioned so that an end portion of the second data line interconnection layer may be relatively depressed in the first direction (e.g. horizontal direction) compared to the location of the end portions of the first and third data line interconnection layers. The ASG bridge contact electrode 84' electrically connects the data interconnection pattern 68 with the ASG bridge electrode 84. Also, the second ASG bridge contact electrode 86' may be connected to the gate electrode 24 and electrically connect the gate electrode 24, the ASG bridge electrode 84, and the data interconnection pattern 68 together.

Referring to FIG. 2A, the protection layer 72 formed on the drain electrode 66 does not overlap with the pixel contact electrode 81' This is because the display substrate according to an exemplary embodiment is formed in three mask processes including a liftoff process. The details of these processes will be described later.

As described above, if the end portions of the semiconductor layer patterns 42 and 44 are formed to protrude beyond the end portions of the data interconnection patterns 66 and 68, and the contact holes 124 and 126 are, respectively, formed to expose at least portions of the upper surfaces of the semiconductor layer patterns 42 and 44 and at least portions of the upper surfaces of the data interconnection patterns 66 and 68, the contact electrodes 81' and 84' become in contact with the upper surfaces of the semiconductor layer patterns 42 and 44, and thus the pixel electrode 81, the ASG bridge electrode 84, and the like are less likely to be opened in the fabricating process.

With reference to FIGS. 3A and 3B, an exemplary test interconnection region that may be used in the peripheral regions (P in FIG. 1), will be described.

FIG. 3A is a plan, top view of a test interconnection region, and FIG. 3B is a sectional view taken along lint E-E' in FIG. 3A.

Referring to FIGS. 3A and 3B, on the insulating substrate 10 in the test interconnection region as illustrated in FIG. 3A, a gate interconnection pattern 29, a gate insulating layer 30, a semiconductor layer pattern 46, a data interconnection pattern 69, and a test interconnection bridge electrode 88 may be formed.

One end portion of the semiconductor layer pattern 46 may be formed to protrude in the first direction (e.g. the horizontal direction) so that it extends beyond an end portion of the data interconnection pattern 69. A first test interconnection bridge contact electrode 88' may be formed on the upper surface of the portion of the semiconductor layer pattern 46 that protrudes in the first direction, as illustrated.

The end portion of the data interconnection pattern 69 (e.g. region F in FIG. 3A) may be in the same shape as the shape as described above with reference to FIG. 2B, and contact holes 129 and 130 may be formed on upper portions of the semiconductor layer pattern 46, the data interconnection pattern 69, and the gate interconnection pattern 29 to expose at least portions of the upper surfaces of the semiconductor layer pattern 46, the data interconnection pattern 69, and the gate interconnection pattern 29. Also, first and second test interconnection bridge contact electrodes 88' and 89' may be formed in the contact holes 129 and 130 to electrically connect the test interconnection bridge electrode 89, the gate interconnection pattern 29, and the data interconnection pattern 69 together.

Because other details of the test interconnection region are the same as those of the ASG region as described above, duplicate description thereof will be omitted. In the same manner as described above, such a shape of the test interconnection region may prevent the test interconnection bridge electrode 89 or the first test interconnection bridge contact electrode 88' from being opened in the fabricating process.

Next, with reference to FIG. 4, the display substrate according to another exemplary embodiment will be described.

Figure 4:
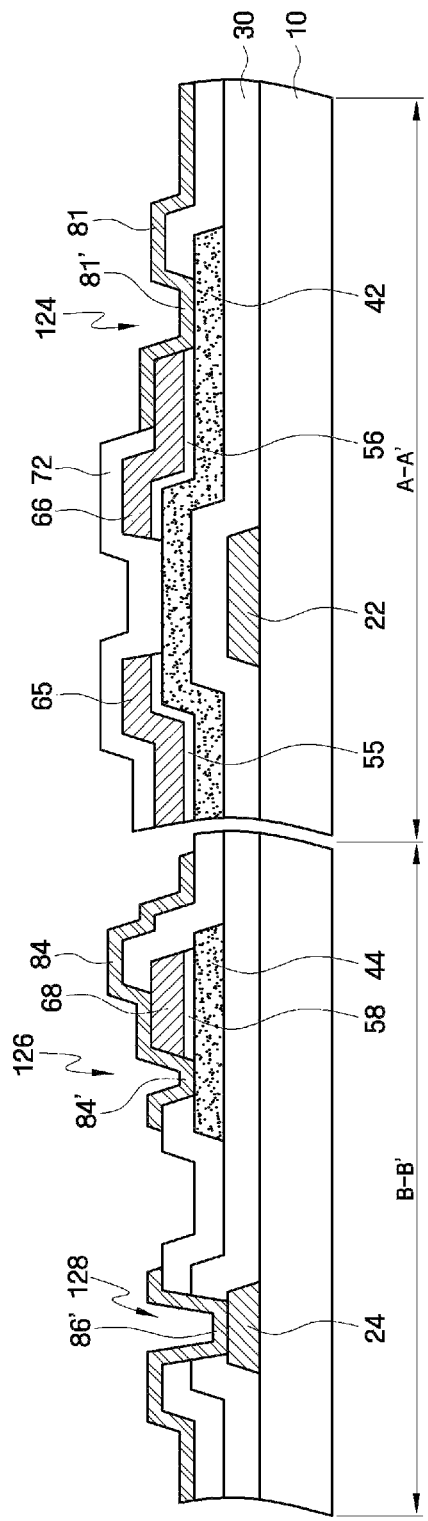
FIG. 4 is a sectional view of a display substrate according to another exemplary embodiment.

FIG. 4 is a sectional view of a display substrate according to another exemplary embodiment. In this embodiment, the description of the duplicate constituent elements of the display substrate, which have been described above with respect to FIGS. 1-3, will be omitted.

Referring to FIGS. 1 and 4, the display substrate may further comprise ohmic contact layer patterns 55, 56, and 58, which are formed on the upper parts of the semiconductor layer patterns 42 and 44, and are made of a material, such as, for example, silicide, n+ hydrogenated amorphous silicon doped, with high-density n-type impurities, or, for example, ITO doped with p-type impurities. In this case, the ohmic contact layer patterns 55 and 56 form a pair, which is positioned on the semiconductor layer pattern 42, and provides good contact characteristics between the source electrode 65 and drain electrode 66, and the semiconductor layer pattern 42.

Although not separately illustrated in the drawing, the ohmic contact layer pattern may be additionally formed in the test interconnection region on semiconductor layer pattern 46 in the same manner as described above.

Next, with reference to FIGS. 5 to 13, a method of fabricating a display substrate according to an exemplary embodiment will be described.

FIGS. 5 to 13 are intermediate step views illustrating a method of fabricating a display substrate. Hereinafter, forming of the ohmic contact layer pattern on the semiconductor layer pattern will be described as an example. However, as described above, the ohmic contact layer pattern may be omitted if necessary. Also, in the case of the test interconnection region, the ohmic contact layer pattern can be formed in the same manner as that in the ASG region, and thus the additional explanation thereof will be omitted. Additionally, description of the duplicate constituent elements of the display substrate, which have been previously described, will be omitted.

Figure 5:
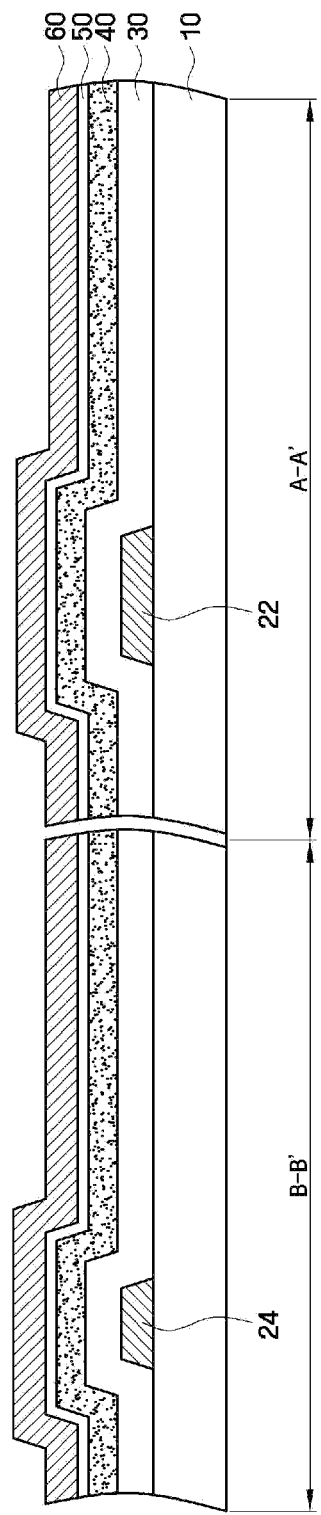
FIGS. 5 to 13 are intermediate step views illustrating a method of fabricating a display substrate according to an exemplary embodiment.

First, referring to FIGS. 1 and 5, the gate interconnection patterns 21, 22, and 24 including the gate electrodes 22 and 24 are formed on the insulating substrate 10. Specifically, the gate conduction layer is laminated onto the insulating substrate 10, for example, using a sputtering method, and then the gate interconnection patterns 21, 22, and 24 including the gate line 21 and the gate electrodes 22 and 24 are formed by etching the gate conduction layer using, for example, a photolithographic method.

Then, onto the resultant product, an insulating layer 30, a semiconductor layer 40 made of, for example, hydrogenated amorphous silicon, and an ohmic contact layer 50 made of a material, such as, for example, silicide, n+ hydrogenated amorphous silicon doped with high-density n-type impurities, or, for example, ITO doped with p-type impurities, are laminated. The gate insulating layer 30, the semiconductor layer 40, and the ohmic contact layer 50 may be laminated onto the gate interconnection patterns 21, 22, and 24 by a chemical vapor deposition (CVD) method.

Then, a data interconnection layer 60 composed of first to third electrode layers is laminated onto the ohmic contact layer 50, for example, using a sputtering method.

The gate insulating layer 30, the semiconductor layer 40, the ohmic contact layer 50, and the data interconnection layer 60 may be laminated onto not only a display region D but also a peripheral region P.

Figure 6:
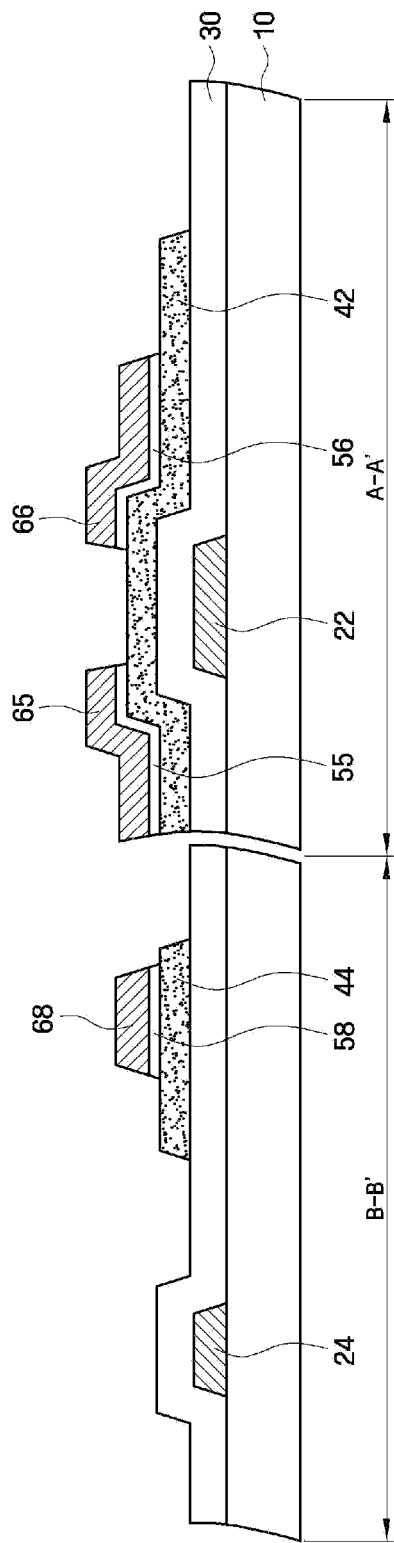

Then, referring to FIGS. 1, 5, and 6, photoresist is spread on the data interconnection 60, and a photoresist pattern (not illustrated) is formed by exposing and developing the spread photoresist. In this case, the photoresist pattern (not illustrated) is formed to cover a region on which the data interconnections 62, 65, 66, and 68 are to be formed and a region on which a channel is to be formed (i.e. gap space between the source electrode 65 and the drain electrode 66) so that the thickness of the photoresist pattern in the region on which the data interconnections 62, 65, 66, and 68 are to be formed is larger than the thickness of the photoresist pattern in the region on which the channel is to be formed. The photoresist pattern (not illustrated) having different thicknesses by regions may be formed using a slit mask or a halftone mask.

Then, the data interconnection layer 60, the ohmic layer 50, and the semiconductor layer 40 are etched using the photoresist pattern (not illustrated) as an etching mask. As described above, if the lower layers are etched through an appropriate process condition, due to the difference in thickness between the photoresist patterns (not illustrated), the semiconductor layer patterns 42 and 44, the source electrode 65 and the drain electrode 66 and the data line 62 and data interconnection pattern 68 are formed by the etching process, as shown in FIG. 6.

Here, referring to FIGS. 2B and 6, the etching of the source electrode 65 and the drain electrode 66, and the data line 62 and data interconnection pattern 68, may be performed using an etching selection ratio of the second electrode layer pattern 66-2 and the first and third electrode layer patterns 66-1 and 66-3 in which the etch rate of the second electrode layer pattern 66-2 is enhanced as compared to the etch rate of the first and third electrode layer pattern 66-1 and 66-3. As a result, end portions of the first and third electrode layer patterns 66-1 and 66-3 protrude in the first direction (e.g. the horizontal direction) so that they extend beyond an end portion of the second electrode layer pattern 66-2. Any photoresist pattern (not illustrated) remaining after the etching process may be removed through an ashing process and so on.

Figure 7:
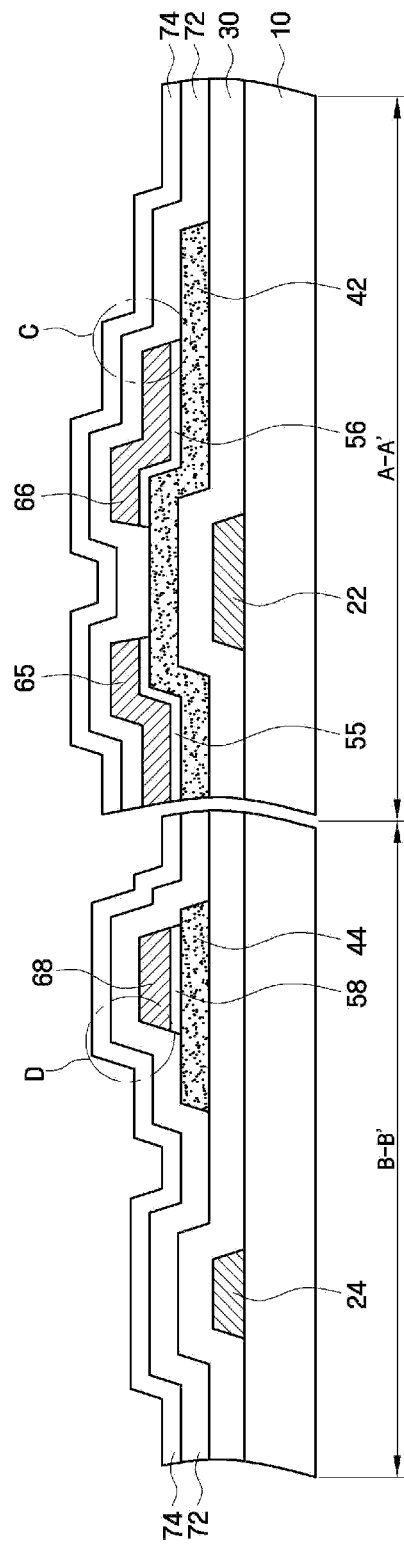

Then, referring to FIGS. 1, 6, and 7, a protection layer 72 and a sacrificial layer 74 are laminated onto the resultant product. The deposition of the protection layer 72 and the sacrificial layer 74 may be performed using a CVD method.

Figure 8:
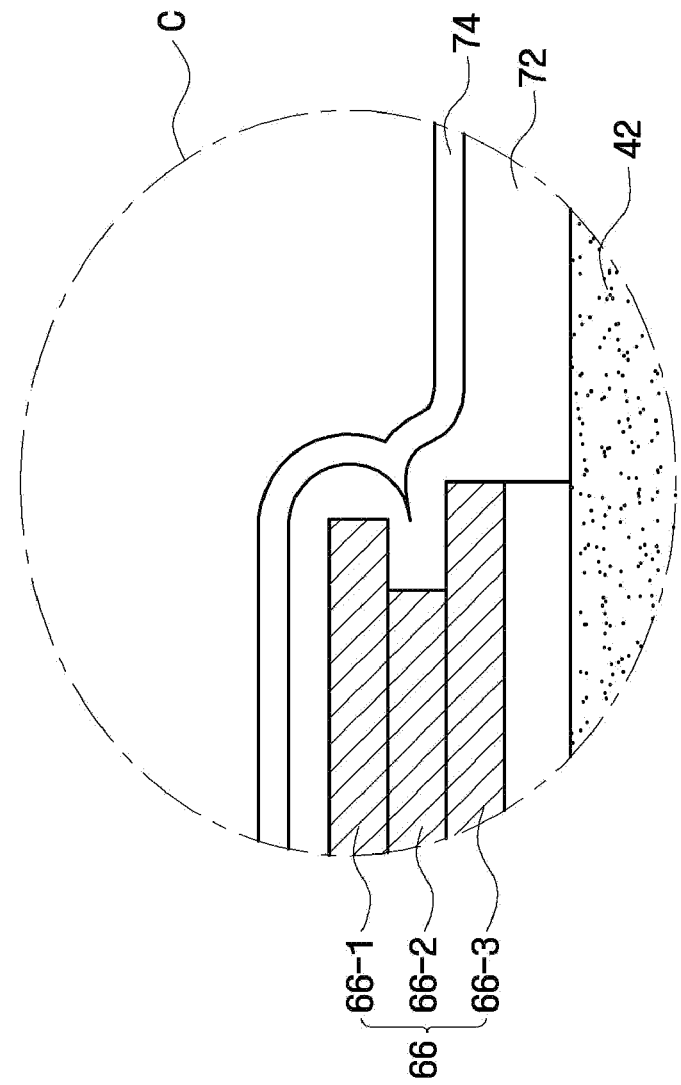

In this case, referring to FIG. 8, an end portion (i.e. region C in FIG. 7) of the drain electrode 66 may be formed so that end portions of the first and third electrode layer patterns 66-1 and 66-3 protrudes in a first direction (e.g. the horizontal direction) so that they extend beyond an end portion of the second electrode layer pattern 66-2. Accordingly, the side surface profile of the protection layer 72 and the sacrificial layer 74 deposited on the drain electrode 66 may be formed to be depressed in a direction of the second electrode layer pattern 66-2 as illustrated in FIG. 8. Although not separately illustrated, an end portion (i.e. region D in FIG. 7) of the data interconnection pattern 68 may be also formed so that the side surface profile of the protection layer 72 and the sacrificial layer 74 deposited on the data interconnection pattern 68 may be formed in the same manner as described above.

Figure 9:
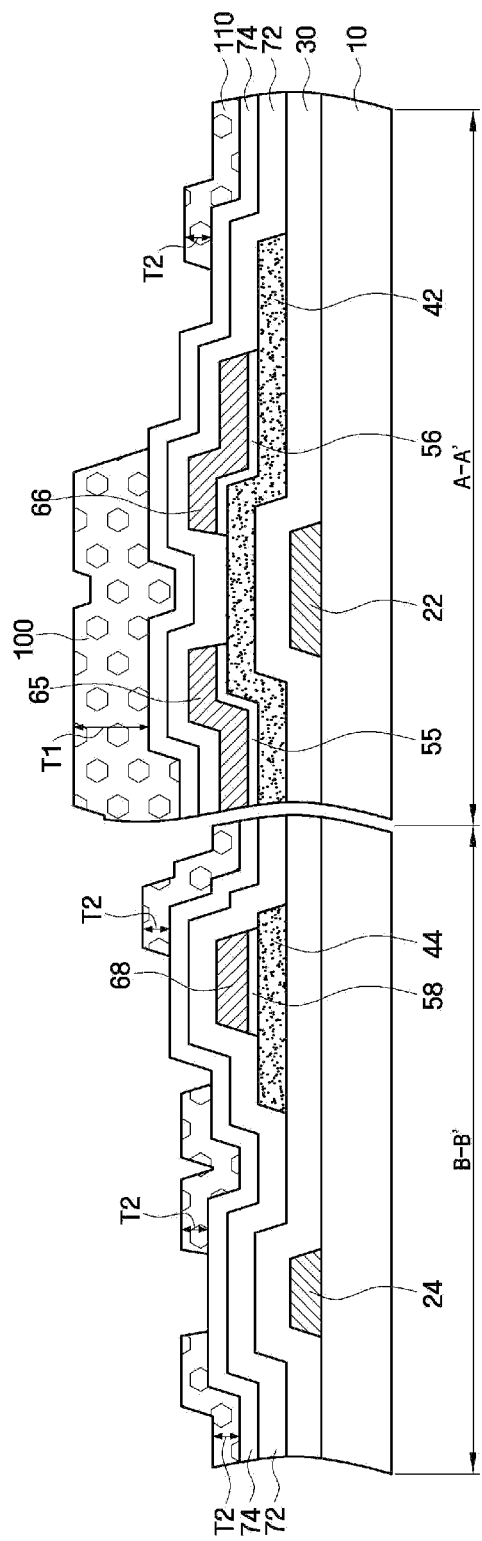

Then, referring to FIGS. 1, 7, and 9, photoresist is spread on the sacrificial layer 74, and a first photoresist pattern 100 with a first thickness T1 and a second photoresist pattern 110 with a second thickness T2 are formed by exposing and developing the spread photoresist. Here, the first thickness T1 of the first photoresist pattern 100 formed on the thin film transistor may be larger than the second thickness T2 of the second photoresist pattern 110 formed on other region s. The first and second photoresist patterns 100 and 110 having different thicknesses as described above may be formed using a slit mask or a halftone mask.

Figure 10:
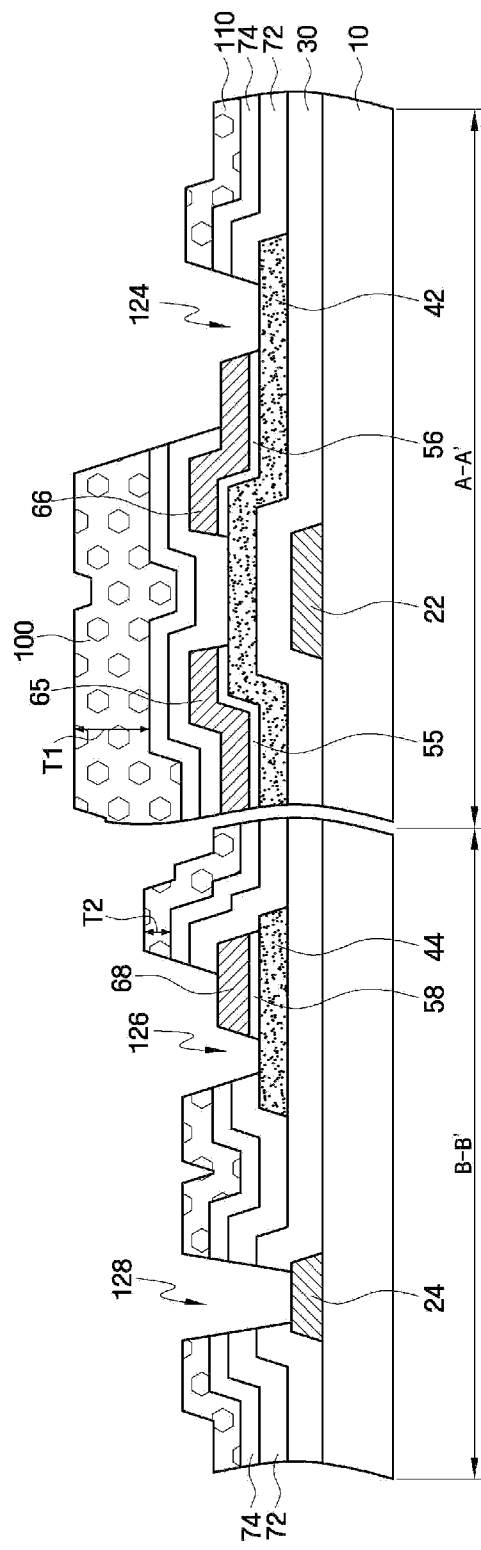

Then, referring to FIGS. 1, 9, and 10, contact holes 124, 126, and 128 may be formed by etching the exposed protection layer 72 and the sacrificial layer 74 using the first and second photoresist patterns 100 and 110 as an etching mask. In this case, the etching of the protection layer 72 may be performed using an etching selection ratio of the protection layer 74 and the semiconductor layer patterns 42 and 44 in which the etch rate of the protection layer 74 is enhanced as compared to the etch rate of the semiconductor layer patterns 42 and 44. Specifically, the etching selection ratio of the protection layer 74 and the semiconductor layer patterns 42 and 44 may be, for example, 16:1 (where the etching selection ratio=(the etch rate of the protection layer 74)/(the etch rate of the semiconductor layer patterns 42 and 44)). Here, the contact holes 124 and 126 may be formed so that at least portions of the upper surfaces of the semiconductor layer patterns 42 and 44, and at least portions of the upper surfaces of the data interconnection patterns 66 and 68, are exposed.

If the contact holes 124 and 126 are not formed so that at least portions of the upper surfaces of the semiconductor layer patterns 42 and 44, and at least portions of the upper surfaces of the data interconnection patterns 66 and 68, are exposed, a pixel electrode 81 and an ASG bridge electrode 84 may be formed on the protection layer 72 and the sacrificial layer 74. The protection layer 72 and the sacrificial layer 74 have a depression formed on an end portion of the data electrode 66 (i.e. region C in FIG. 7, see FIG. 8) and an end portion of the data interconnection pattern 68 (i.e. region D in FIG. 7). In this case, due to the depressed side surface profile of the protection layer 72 and the sacrificial layer 74, the pixel electrode 81 and the ASG bridge electrode 84 may be opened. Accordingly, to prevent such opening, as illustrated in FIG. 10, the contact holes 124 and 126 are formed so that at least a portion of the upper surface of the semiconductor layer patterns 42 and 44, and at least a portion of the upper surface of the data interconnection patterns 66 and 68 are exposed Then, referring to FIGS. 1, 10, and 11, the second photoresist pattern 110 is etched back until the sacrificial layer 74 is exposed. The upper part of the first photoresist pattern 100 is partially etched to be deformed to a third photoresist pattern 100'.

Figure 11:
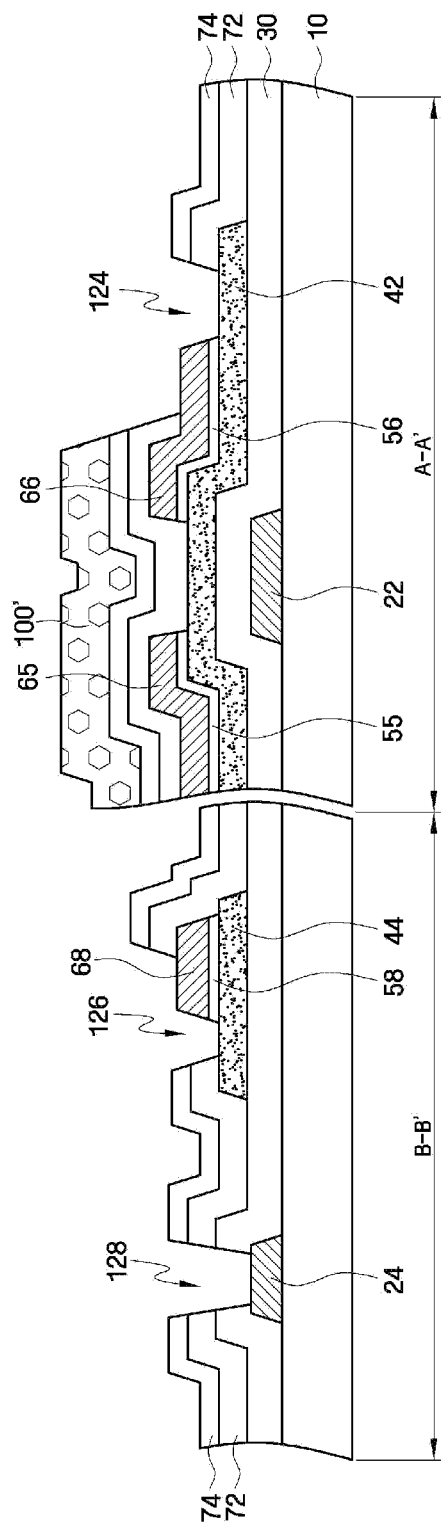
Figure 12:
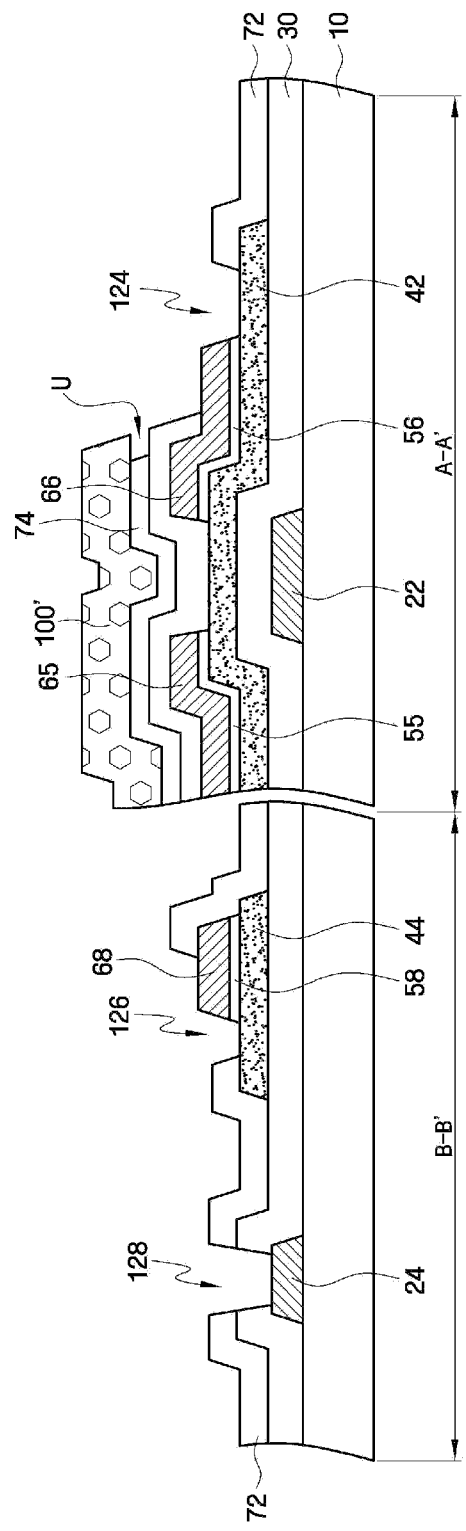

Then, referring to FIGS. 1, 11, and 12, the exposed sacrificial layer 74 is isotropically etched. For example, the etching of the sacrificial layer 74 may be performed by dry etching, and an etching gas may include, for example, $CF_4$, $SF_6$, $CHF_3$, $O_2$, or their combination.

Through the above-described isotropic etching process, an undercut (see reference numeral "U") may be formed on the lower part of the third photoresist pattern 100' by etching of an edge portion of the sacrificial layer 74 that is underneath the third photoresist pattern 100'.

Figure 13:
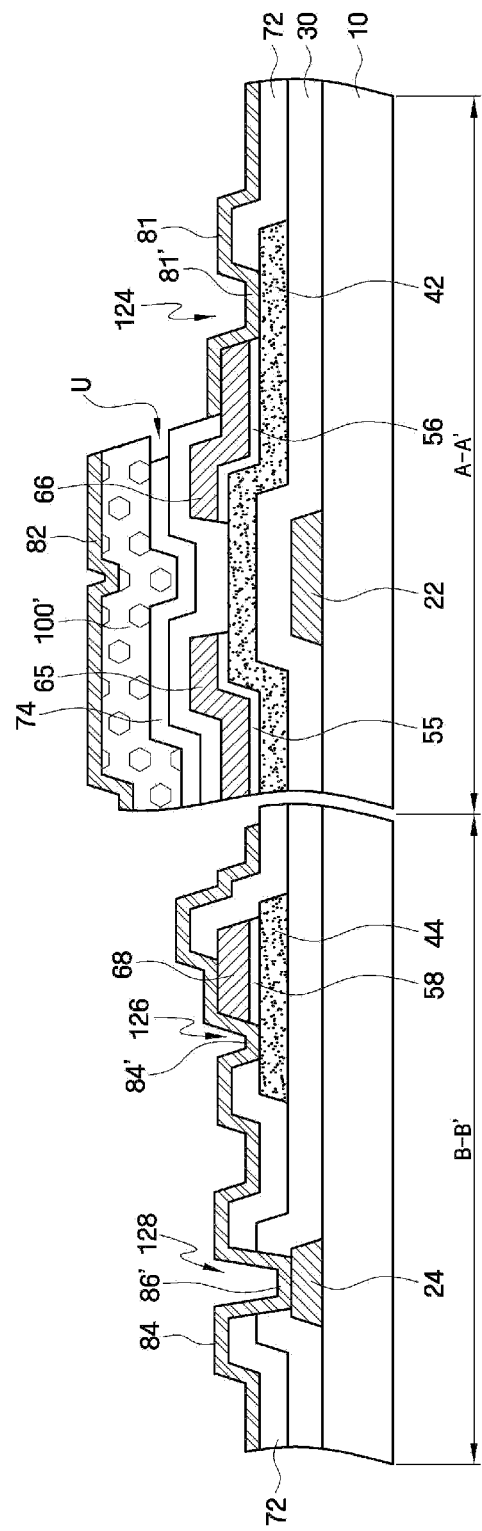

Then, referring to FIGS. 1, 12, and 13, a pixel electrode 81, a conduction material for the pixel electrode 82, and an ASG bridge electrode 84 may be formed by laminating a transparent conductor such as, for example, ITO (Indium Tin Oxide) or IZO (Indium Zinc Oxide) or a reflective conductor such as, for example, aluminum onto the resultant product by, for instance, a sputtering method. In this case, a pixel contact electrode 81' and a first ASG bridge contact electrode 84' are also formed in the contact holes 124 and 126, and as described above, these pixel contact electrode 81' and first ASG bridge contact electrode 84' are formed to be in contact with the upper surfaces of the semiconductor layer patterns 42 and 44, respectively, so that they are connected to the data interconnection patterns 66 and 68 so as to electrically connect the drain electrode 66 with the pixel electrode 81 and to electrically connect the data interconnection pattern 68 with the ASG bridge electrode 84. More specifically, as described above, the pixel contact electrode 81' and the first ASG bridge contact electrode 84' may be formed to be in contact with at least one of the first and third electrode layer patterns of the data interconnection patterns 66 and 68.

Then, referring to FIGS. 1, 4, and 13, the third photoresist pattern 100' and the conduction material 82 for the pixel electrode that exists on the third photoresist pattern 100' may be removed using a liftoff method. Specifically, for example, by injecting a stripping agent, such as, for example, amine, glycol, and the like, into a region where the conduction material 82 for the pixel electrode does not exist, corresponding to the above-described undercut U, in, for instance, a spray method or dipping method. The stripping agent comes into contact with the third photoresist pattern 100', dissolves and peels off the third photoresist pattern 100', and simultaneously removes the conduction material 82 for the pixel electrode existing on the third photoresist pattern 100'. As a result, the display substrate from which the third photoresist pattern 100' has been removed as illustrated in FIG. 4 can be obtained.

As described above, by forming the semiconductor layer patterns 42 and 44 so that an end portion of the semiconductor layer patterns 42 and 44 protrudes beyond an end portion of the data interconnection patterns 66 and 68, and forming the contact holes 124 and 126 so that at least a portion of the upper surface of the semiconductor layer patterns 42 and 44 and at least a portion of the upper surface of the data interconnection patterns 66 and 68 are exposed, the contact electrodes 81' and 84' are connected to the data interconnection patterns 66 and 68 and in contact with the upper surface of the semiconductor layer patterns 42 and 44, and thus opening of the upper conduction layers of the contact electrode 81, the ASG bridge electrode 84, and the like is less likely to occur.

Although typical embodiments have been described for illustrative purposes, those skilled in the art will appreciate that various modifications, additions and substitutions are possible, without departing from the scope and spirit of the disclosure and the accompanying claims.

What is claimed is:

1. A method of fabricating a display substrate comprising:
    forming a semiconductor layer and a data interconnection layer on a substrate;
    forming a semiconductor layer pattern and a data interconnection pattern by etching the semiconductor layer and the data interconnection layer so that an end portion of the semiconductor layer pattern is protruded in one direction beyond an end portion of the data interconnection pattern;
    forming a protection layer and a sacrificial layer on the substrate;
    forming contact holes so that at least a portion of an upper surface of the semiconductor layer pattern and at least a portion of an upper surface of the data interconnection pattern are exposed by etching the protection layer using an etching selection ratio of the protection layer and the semiconductor layer pattern in which the etch rate of the protection layer is greater than the etch rate of the semiconductor layer pattern; and
    forming contact electrodes in the contact holes.

2. The method of claim 1, wherein the data interconnection comprises first, second and third electrode layers patterns; and
    an end portion of each of the first and third electrode layer patterns protrudes in one direction beyond an end portion of the second electrode layer pattern.

3. The method of claim 2, wherein the end portion of the third electrode layer pattern protrudes in the one direction beyond the end portion of the first electrode layer pattern.

4. The method of claim 2, wherein the first and third electrode layers comprise molybdenum (Mo) or a molybdenum (Mo) alloy.

5. The method of claim 2, wherein the second electrode layer comprises aluminum (Al) or an aluminum (Al) alloy.

6. The method of claim 1, wherein the etching selection ratio of the protection layer to the semiconductor layer is 16:1.

7. The method of claim 1, wherein the forming the contact hole comprises:
    forming a first photoresist pattern with a first thickness and a second photoresist pattern with a second thickness that is different from the first thickness on the protection layer and the sacrificial layer; and
    forming the contact holes by etching the protection layer and the sacrificial layer using the first and second photoresist patterns as a mask.

8. The method of claim 7, wherein the first thickness is larger than the second thickness.

9. The method of claim 7, wherein the forming the contact electrode in the contact hole comprises:
    forming a third photoresist pattern by etching back the first and second photoresist patterns;
    etching the sacrificial layer;
    forming a conduction layer in the contact hole and on the third photoresist pattern; and
    lifting off the third photoresist pattern on which the conduction layer is formed.

10. The method of claim 9, wherein the etching the sacrificial layer comprises forming an undercut by etching an edge portion the sacrificial layer that is underneath the third photoresist pattern.

11. The method of claim 9, wherein the conduction layer is in contact with the upper surface of the exposed semiconductor layer pattern and the first or third electrode layer pattern.

12. The method of claim 1, further comprising:
    forming an ohmic contact layer on the semiconductor layer; and
    forming an ohmic contact layer pattern by etching the ohmic contact layer.

13. A method of fabricating a display substrate comprising:
    sequentially forming a semiconductor layer and a data interconnection layer that comprises first, second and third electrode layers on a substrate;
    forming a semiconductor layer pattern and a data interconnection pattern that comprises first, second and third electrode layer patterns by etching the semiconductor layer and the data interconnection layer so that an end portion of the semiconductor layer pattern protrudes in one direction beyond an end portion of the data interconnection pattern;

forming a protection layer and a sacrificial layer on the substrate;

forming a first photoresist pattern with a first thickness and a second photoresist pattern with a second thickness that is smaller than the first thickness on the protection layer and the sacrificial layer;

forming contact holes so that at least a portion of an upper surface of the semiconductor layer pattern and at least a portion of an upper surface of the data interconnection pattern are exposed by etching the protection layer and the sacrificial layer in an etching selection ratio in which the etch rate of the protection layer is greater than the etch rate of the semiconductor layer using the first and second photoresist patterns as a mask;

forming a third photoresist pattern by etching back the first and second photoresist patterns;

forming an undercut by etching an edge portion of the sacrificial layer underneath the third photoresist pattern;

forming a conduction layer on an upper part of the third photoresist pattern and on an upper surface of the exposed semiconductor layer pattern so that the conduction layer is in contact with the first or third electrode layer pattern; and lifting off the third photoresist pattern.

* * * * *